(12) United States Patent
Zeng et al.

(10) Patent No.: US 11,670,222 B2
(45) Date of Patent: Jun. 6, 2023

(54) DRIVING BACKPLATE AND DISPLAY DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Qin Zeng, Beijing (CN); Zouming Xu, Beijing (CN); Jian Tian, Beijing (CN); Jie Lei, Beijing (CN); Jie Wang, Beijing (CN); Jianying Zhang, Beijing (CN); Xintao Wu, Beijing (CN); Chunjian Liu, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/488,621

(22) Filed: Sep. 29, 2021

(65) Prior Publication Data
US 2022/0165206 A1 May 26, 2022

(30) Foreign Application Priority Data
Nov. 23, 2020 (CN) .......................... 202022726724.8

(51) Int. Cl.
*G09G 3/32* (2016.01)

(52) U.S. Cl.
CPC ....... *G09G 3/32* (2013.01); *G09G 2300/0413* (2013.01); *G09G 2330/028* (2013.01)

(58) Field of Classification Search
CPC ............ G09G 3/32; G09G 2300/0413; G09G 2330/028; H01L 25/167
See application file for complete search history.

(56) References Cited

U.S. PATENT DOCUMENTS

| | | | |
|---|---|---|---|
| 10,283,037 B1* | 5/2019 | Far ........................... | G09G 3/32 |
| 2014/0168037 A1* | 6/2014 | Sakariya .............. | G09G 3/3216 345/82 |
| 2017/0068362 A1* | 3/2017 | Den Boer ............. | G06F 3/0443 |
| 2018/0122298 A1* | 5/2018 | Lee ..................... | H01L 27/1225 |
| 2018/0211945 A1* | 7/2018 | Cok .................... | H01L 33/0093 |
| 2020/0335032 A1* | 10/2020 | Kiik ........................ | G06F 3/013 |
| 2021/0148554 A1* | 5/2021 | Hin ......................... | H01L 33/64 |

* cited by examiner

*Primary Examiner* — Andrew Sasinowski
(74) *Attorney, Agent, or Firm* — Houtteman Law LLC

(57) ABSTRACT

The disclosure provides a driving backplate and a display device. The driving backplate includes a substrate having a plurality of light source regions where light sources are disposed, the plurality of light source regions being arranged in an array; and a plurality of control chips arranged in an array on the substrate, the plurality of control chips being in one-to-one correspondence with the plurality of light source regions and each configured to provide a driving signal to the light source in a corresponding light source region, wherein each column of control chips is divided into at least two groups, each group of control chips are coupled in series through a same signal line, and the at least two groups of control chips are coupled in parallel with each other.

20 Claims, 6 Drawing Sheets

DRIVING BACKPLATE AND DISPLAY DEVICE

CROSS-REFERENCE TO RELATED APPLICATION

This application claims the benefit of priority to Chinese Patent Application No. 202022726724.8 filed on Nov. 23, 2020, the contents of which are incorporated herein in their entirety by reference.

TECHNICAL FIELD

The present disclosure relates to the field of display technology, and particularly relates to a driving backplate and a display device.

BACKGROUND

Due to the structural characteristics of the Mini LED backlight module, such as a direct-light-type structure, the Mini LED backlight module is more suitable for high-end liquid crystal display devices.

SUMMARY

In a first aspect, the present disclosure provides a driving backplate including:

a substrate having a plurality of light source regions in which light sources are disposed, the plurality of light source regions being arranged in an array; and a plurality of control chips arranged in an array on the substrate, the plurality of control chips being in one-to-one correspondence with the plurality of light source regions and each configured to provide a driving signal to the light source in a corresponding light source region, wherein each column of control chips is divided into at least two groups, each group of control chips are coupled in series through a same signal line, and the at least two groups of control chips are coupled in parallel with each other.

In an embodiment, each column of control chips is divided into a first group and a second group, and a number of the control chips in the first group is the same as a number of the control chips in the second group.

In an embodiment, the first group includes odd-numbered control chips in the column of control chips and the second group includes even-numbered control chips in the column of control chips.

In an embodiment, the first group includes a first half of the column of control chips and the second group includes a second half of the column of control chips.

In an embodiment, every adjacent two of the control chips in each column constitute a pair of control chips, and the first group includes odd-numbered pairs of control chips and the second group includes even-numbered pairs of control chips.

In an embodiment, the light sources in each column of light source regions are coupled to a same power line for providing a power supply voltage to the light sources in the column of light source regions.

In an embodiment, each of the plurality of light source regions includes a plurality of light sources coupled in series.

In an embodiment, the plurality of light sources in each of the plurality of light source regions are arranged in an array.

In an embodiment, a number of the plurality of light sources in each of the plurality of light source regions is 4.

In an embodiment, the driving backplane further includes a plurality of dummy light source regions arranged in an array, wherein no light sources are disposed in the dummy light source region.

In an embodiment, the plurality of dummy light source regions are provided with white oil.

In an embodiment, the plurality of light source regions and the plurality of dummy light source regions are alternately arranged.

In another aspect, the present disclosure provides a display device including the driving backplane according to the embodiment of the present disclosure.

In another aspect, the present disclosure provides a method of manufacturing a driving backplate, the driving backplate being the driving backplate according to the embodiment of the present disclosure, the method including:

forming a first electrode layer over a buffer layer by a process of sputtering, coating, baking, photo-exposing, developing, hard baking, etching, and stripping;

forming a first insulating layer covering the first electrode layer by a sputtering process;

forming a first planarization layer on the first insulating layer by a process of coating, photo-exposing and developing;

forming a second electrode layer on the first planarization layer by a process of sputtering, coating, baking, photo-exposing, developing, hard baking, etching, and stripping;

forming a second insulating layer on the second electrode layer by a sputtering process;

forming a second planarization layer on the second insulating layer by a process of coating, photo-exposing and developing;

forming a via hole in the second planarization layer such that at least part of the second electrode layer is exposed; and forming the light source or the control chip in the via hole, wherein the first electrode layer serves as the signal line, and the second electrode layer serves as a conductive line coupled to the light source.

BRIEF DESCRIPTION OF THE DRAWINGS

The accompanying drawings, which are to provide a further understanding of the present disclosure and constitute a part of the specification, serve to explain the present disclosure together with the embodiments described below, but do not constitute a limitation of the present disclosure. In the drawings.

DETAILED DESCRIPTION

Figure 1:
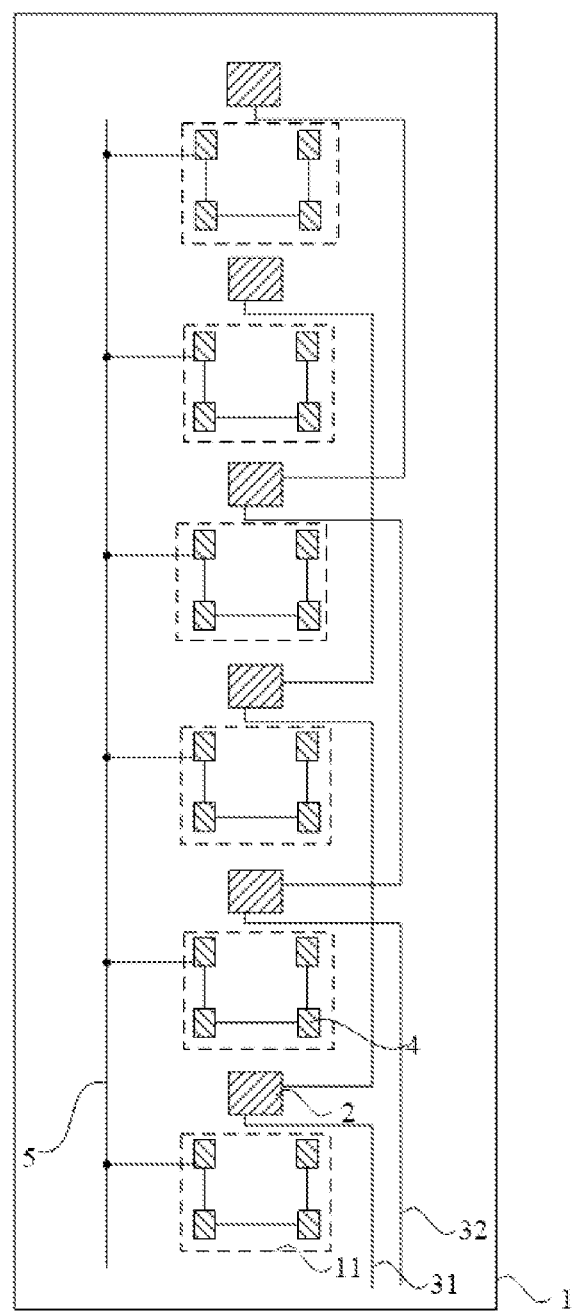
FIG. 1 is a schematic structural diagram of a driving backplate according to an embodiment of the present disclosure.

In order that those skilled in the art can better understand the technical solutions of the present disclosure, the following detailed description is given with reference to the accompanying drawings and the specific embodiments.

Compared with a traditional direct-light-type backlight module, the number of light sources (i.e., lamp beads) of a Mini LED backlight module of related art can be greatly increased due to the extremely small size of lamp beads, which allows the Mini LED backlight module to have more adjustable partitions, thereby achieving fine adjustment of the light source and high dynamic range (HDR) images, and thus the display effect of a display device is greatly improved, and the market competitiveness of the display device is further enhanced. At present, for a Mini LED backlight module driven in an active matrix (AM) mode, each light source region may be controlled by an independent control chip, so that the driving efficiency is higher, the driving for a larger area can be realized, and the better brightness uniformity and contrast can be realized.

However, since the number of the lamp beads in the large-sized display device is large, the number of the corresponding control chips is also large, and the control chips in each column are coupled via a single signal line, which results in that the driving line for the lamp beads is long, the driving time is long, and the refreshing frequency of the display device is influenced.

In the present disclosure, the "patterning process" refers to a step of forming a structure having a specific pattern, which may be a photolithography process including one or more steps of forming a material layer, coating a photoresist, exposing, developing, etching, stripping the photoresist, and the like. Of course, the "patterning process" may also be an imprinting process, an inkjet printing process, or other processes.

The present disclosure will be described in more detail below with reference to the accompanying drawings. Like elements are denoted by like reference numerals throughout the various figures. For purposes of clarity, the various features in the drawings are not drawn to scale. Moreover, certain well-known elements may not be shown in the figures.

Numerous specific details of the present disclosure, such as structures, materials, sizes, and processes of components, are set forth in the following description in order to provide a more thorough understanding of the present disclosure. However, as will be understood by those skilled in the art, the present disclosure may be practiced without these specific details.

As shown in FIG. 1 to FIG. 5, the present embodiment provides a driving backplate, which includes a substrate 1 and a plurality of control chips 2 disposed on the substrate 1. In an embodiment, the substrate 1 has a plurality of light source regions 11, each light source region 11 is provided with light sources 4, and the plurality of light source regions 11 are arranged in an array. The plurality of control chips 2 are arranged in an array, are in one-to-one correspondence with the plurality of the light source regions 11, and are configured to provide driving signals to the light sources 4 in the corresponding light source region 11. It is understood that the control chip 2 is electrically coupled to the light source region 11 corresponding thereto. The plurality of control chips 2 are divided into at least two groups, and each group of control chips 2 are coupled to the same signal line 31 or 32. FIG. 1 shows an arrangement of one column of light source regions 11 (or one column of control chips 2), which also applies to the arrangement of the light source regions 11 and the control chips in the other columns. It is understood that the plurality of light source regions 11 arranged in an array include a plurality of columns of light source regions 11 arranged in a row direction, and the plurality of control chips 2 arranged in an array include a plurality of columns of control chips arranged in the row direction.

In an embodiment, the substrate 1 may be a structure for carrying the light source 4 and the control chip 2. The light source region 11 of the substrate 1 may be provided therein with light sources 4.

Both the light source regions 11 and the control chips 2 are arranged in an array, and the light source regions 11 are in one-to-one correspondence with the control chips 2. As shown in FIG. 1, each control chip 2 may be located on a side of the corresponding light source region 11. For example, the respective control chips 2 may be located on the same side of the respective light source regions 11. It should be noted that the relative position between each control chip 2 and the corresponding light source region 11 may be other suitable cases and is not limited to the cases listed above.

Each control chip 2 is configured to control the light sources 4 in the light source region 11 corresponding thereto. A plurality of control chips 2 are coupled to a single signal line 3 for inputting the control signal to the control chips 2. In an embodiment, the plurality of control chips 2 are divided into at least two groups, and each group of control chips 2 are coupled to the same signal line 3. In an embodiment, each column of control chips may be divided into two groups, or each column of control chips may be divided into 3 groups, or other suitable grouping manners may be adopted. In an embodiment, the signal line coupled to one group of control chips is connected in parallel with the signal line coupled to another group of control chips.

It should be noted that, in the related art, for a Mini LED backlight module driven in an active matrix (AM) mode, each light source region may be controlled by an independent control chip, so that the driving efficiency is higher, the driving for a larger area can be realized, and the better brightness uniformity and contrast can be realized, resulting in that the Mini LED backlight module driven in an active matrix (AM) mode becomes a first-choice for driving circuit in the large-sized product. However, the number of the light sources 4 (lamp beads) of a large-sized product may reach tens of thousands. In the case where four or six LED lamp beads are coupled in series to form one light source region 11, the number of the light source regions 11 may reach thousands, and thus a corresponding number of control chips are required to control the light source regions 11. For Mini-LED backlight products, the lamp beads are generally partitioned in an array including rows and columns, and all partitions in the column direction are coupled in series, resulting in that the driving line of the respective lamp beads is long, the driving time is long, and the refreshing frequency of the display device is influenced.

In the driving backplate provided by this embodiment, the plurality of control chips 2 are divided into at least two groups, and each group of control chips 2 are coupled to the same signal line 3, so that the number of the control chips 2 coupled to a single signal line 3 can be well controlled. Compared with the related art (a single signal line is coupled to a large number of control chips 2), in the driving backplate of the embodiment, by means of grouping, the signal line 3 is coupled to a proper number of control chips 2, so that the problems of long driving line, long driving time and the like of the light sources 4 in each light source region 11 can be avoided, and the refresh frequency of the display device equipped with the driving backplate is ensured.

In addition, because a single signal line 3 in the driving backplate is coupled to a proper number of control chips 2 in series, the phenomenon that the current flowing through a single signal line 3 is too large due to too much load on the signal line can be avoided, so that the light source 4 is protected (the phenomenon that the lamp bead bursts and the like is avoided), and the phenomenon that the parasitic capacitance between the signal lines 3 is too large can be avoided, thereby ensuring the performance of the driving backplate.

It should be noted that the structure of the substrate and the control chip in the driving backplate of the embodiment can also be applied to a backlight module.

In an embodiment, each column of control chips 2 is divided into at least two groups.

In an embodiment, when each column of control chips 2 are divided into at least two groups, the number of the signal lines 3 corresponding to each column of control chips 2 is at least two.

Thus, the layout of the plurality of signal lines 3 in the whole driving backplate is facilitated, so that the layout structure of the driving backplate is simple, and the fabrication process is simple.

In an embodiment, each column of control chips 2 are divided into a first group and a second group, and the number of the control chips 2 in the first group is the same as the number of the control chips 2 in the second group.

In an embodiment, each column of control chips 2 may be divided into two groups with the same number of control chips, that is, each column of control chips 2 corresponds to two signal lines 3, and the number of the control chips 2 coupled in series by each of the two signal lines 3 is the same, so that the loads on the signal lines 3 are the same, the currents are the same, and the brightness of the light sources 4 in the driving backplate can be ensured to be consistent.

In an embodiment, as shown in FIG. 1, the odd-numbered control chips 2 in each column of control chips 2 constitute the first group, and the even-numbered control chips 2 in each column of control chips 2 constitute the second group.

As shown in FIG. 1, one of any two adjacent control chips 2 is coupled to a first signal line 31, and the other thereof is coupled to a second signal line 32.

In an embodiment, in each column of control chips 2, the first signal line 31 couples the odd-numbered control chips 2 (i.e., the control chips 2 in the first group) in series, and the second signal line 32 couples the even-numbered control chips 2 (i.e., the control chips 2 in the second group) in series.

In other words, in a column of control chips 2, the first signal line 31 is coupled to an input terminal of the first control chip, an output terminal of the first control chip is coupled to an input terminal of the third control chip through the first signal line 31, an output terminal of the third control chip is coupled to an input terminal of the fifth control chip through the first signal line 31, and so on.

Similarly, in a column of control chips 2, the second signal line 32 is coupled to an input terminal of the second control chip, an output terminal of the second control chip is coupled to an input terminal of the fourth control chip through the second signal line 32, an output terminal of the fourth control chip is coupled to an input terminal of the sixth control chip through the second signal line 32, and so on.

Thus, for the two signal lines 3 corresponding to one column of control chips 2, the number and arrangement of the control chips 2 coupled to the two signal lines are completely the same, and thus, the loads on the two signal line 3 are the same, so that the currents flowing through the two signal line 3 are the same, and the brightness of the light sources 4 in the driving backplate can be further ensured to be consistent.

Figure 2:
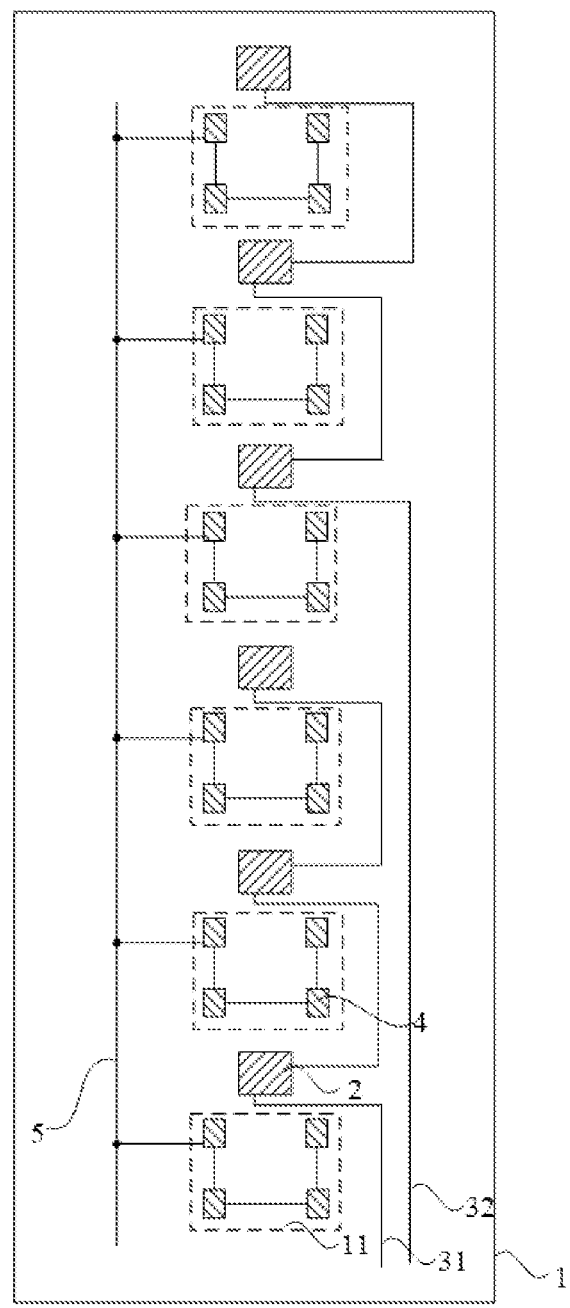
FIG. 2 is a schematic structural diagram of a driving backplate according to an embodiment of the present disclosure.

In an embodiment, as shown in FIG. 2, the first half of the control chips 2 in each column constitute the first group, and the second half of the control chips 2 in each column constitute the second group.

That is, the first signal line 31 couples the first half of the control chips 2 in each column in series, and the second signal line 32 couples the second half of the control chips 2 in each column in series.

Figure 3:
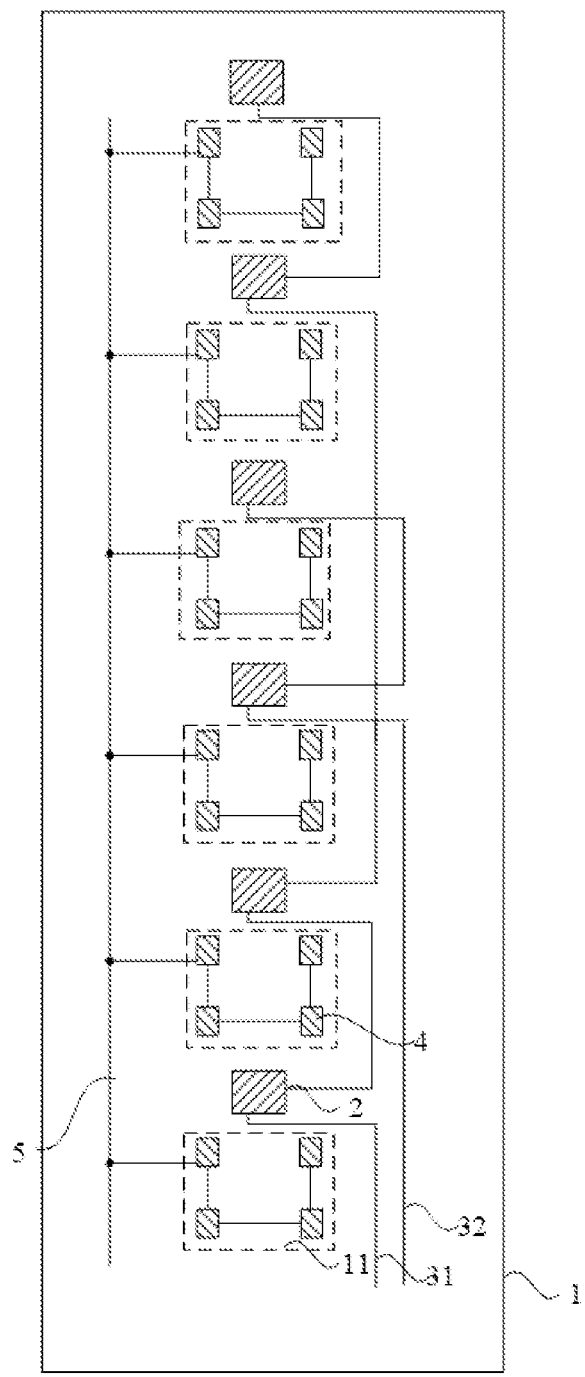
FIG. 3 is a schematic structural diagram of a driving backplate according to an embodiment of the present disclosure.

In an embodiment, as shown in FIG. 3, in each column of control chips 2, starting from the first control chip 2, every two control chips 2 constitute a sub-group, the odd-numbered sub-groups constitute the first group, and the even-numbered sub-groups constitute the second group.

That is, in the same column of control chips 2, the first signal line 31 couples the $1^{st}$, $2^{nd}$, $5^{th}$, $6^{th}$, $9^{th}$ and $10^{th}$ . . . control chips in series, and the second signal line 32 couples the $3^{rd}$, $4^{th}$, $7^{th}$, $8^{th}$, $11^{th}$ and $12^{th}$ . . . control chips in series.

It should be noted that the grouping of the control chips 2 in each column is not limited to the above-mentioned example, and may be in other suitable forms, which are not listed here.

It should be noted that the first signal line 31 and the second signal line 32 are coupled in parallel.

In an embodiment, four light sources 4 are disposed in each light source region 11, and all the light sources 4 are arranged in an array.

That is, the four light sources 4 in each light source region 11 are arranged in a 4×4 array, and the four light sources 4 in each light source region are coupled in series.

In an embodiment, as shown in FIGS. 1 to 3, the light sources 4 in each column of light source regions 11 are coupled to the same conductive line 5. That is, in each column of light source regions 11, the respective light source regions 11 are coupled in parallel with each other.

The conductive line 5 may be configured to provide power to the light source 4. When the light sources 4 are arranged in each column of light source regions 11, the light sources 4 in each light source region 11 can be lightened up. In this case, the driving backplate is a driving backplate with a high density of light source regions, i.e., the number of the light sources 4 is relatively large.

Figure 4:
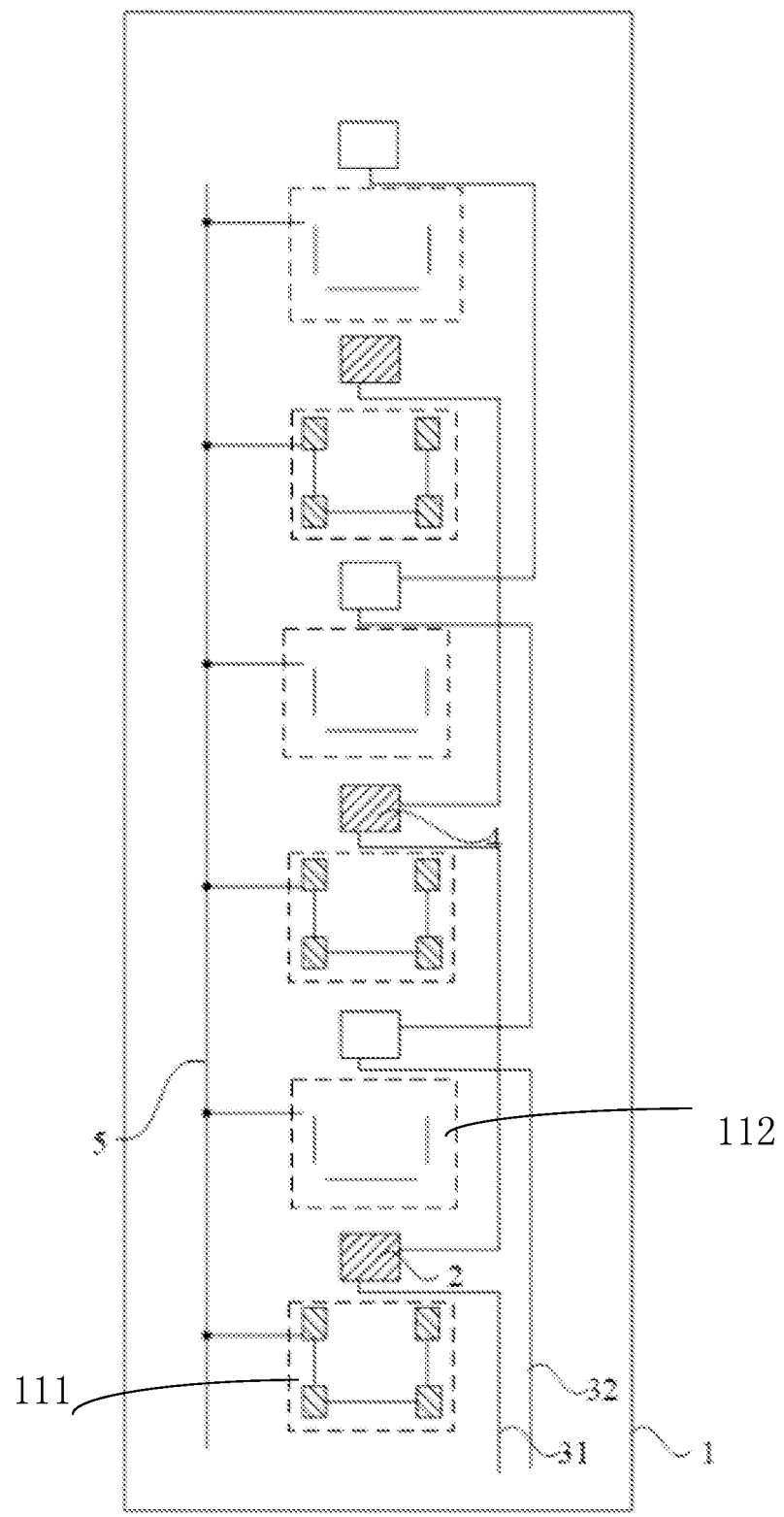
FIG. 4 is a schematic structural diagram of a driving backplate according to an embodiment of the disclosure.

In an embodiment, referring to FIG. 4, the light source regions 11 are divided into active light source sub-regions 111 and dummy light source sub-regions 112, the light sources 4 are disposed in the active light source sub-region, the dummy light source sub-region is not provided with the light source 4, and the control chips 2 corresponding to the active light source sub-region are coupled to the same signal line 3.

In an embodiment, the active light source sub-regions and the dummy light source sub-regions are alternately distributed.

By selectively arranging the light sources 4 in the light source regions 11, the driving backplate having different partitions can be formed by using the same mask.

In an embodiment, as shown in FIGS. 1 and 4, in each column of light source regions 11, one light source region 11 of any two adjacent light source regions 11 is provided with the light source 4, and the other light source region 11 is not provided with the light source 4.

In an embodiment, as shown in FIG. 1 and FIG. 4, in each column of light source regions 11, when one light source region 11 of any two adjacent light source regions 11 is provided with a light source 4, and the other light source region 11 is not provided with a light source 4, that is, the light sources 4 in only half of the light source regions 11 can be lightened up. In this case, the driving backplate is a driving backplate with a low density of light source regions, that is, the number of light sources 4 is relatively small.

In this way, the light sources 4 are selectively arranged in the light source regions 11, and the light source regions 11 are distributed in an array, so that two different driving backplates with a high-density light source region and a low-density light source region can be formed by using the same mask.

It should be noted that the control chip 2 corresponding to the light source region 11 without the light source 4 may also be omitted; and the light source region 11 without the light source 4 may be covered with white oil, thereby saving costs.

In an embodiment, the light source 4 is a mini light emitting diode (or Mini LED), that is, the driving backplate of the embodiment is a Mini LED driving backplate.

In an embodiment, the size of each light source 4 (lamp bead) may be 100 μm to 300 μm.

Figure 5:
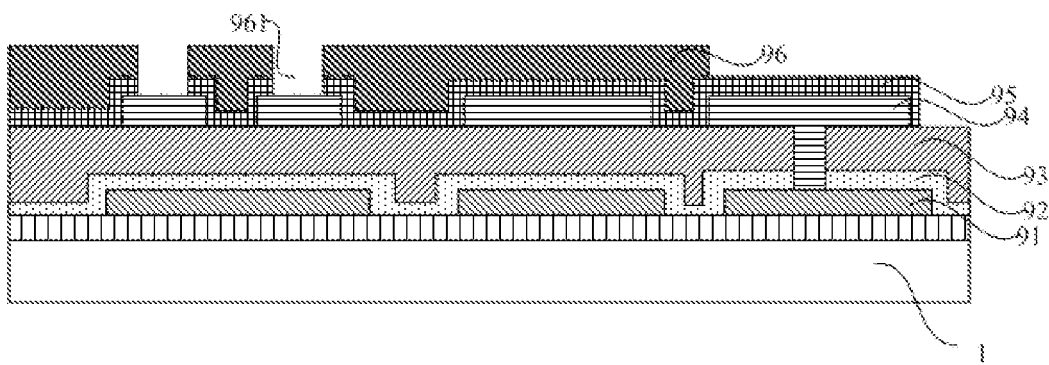
FIG. 5 is a schematic cross-sectional view of a driving backplate according to an embodiment of the present disclosure.
Figure 6:
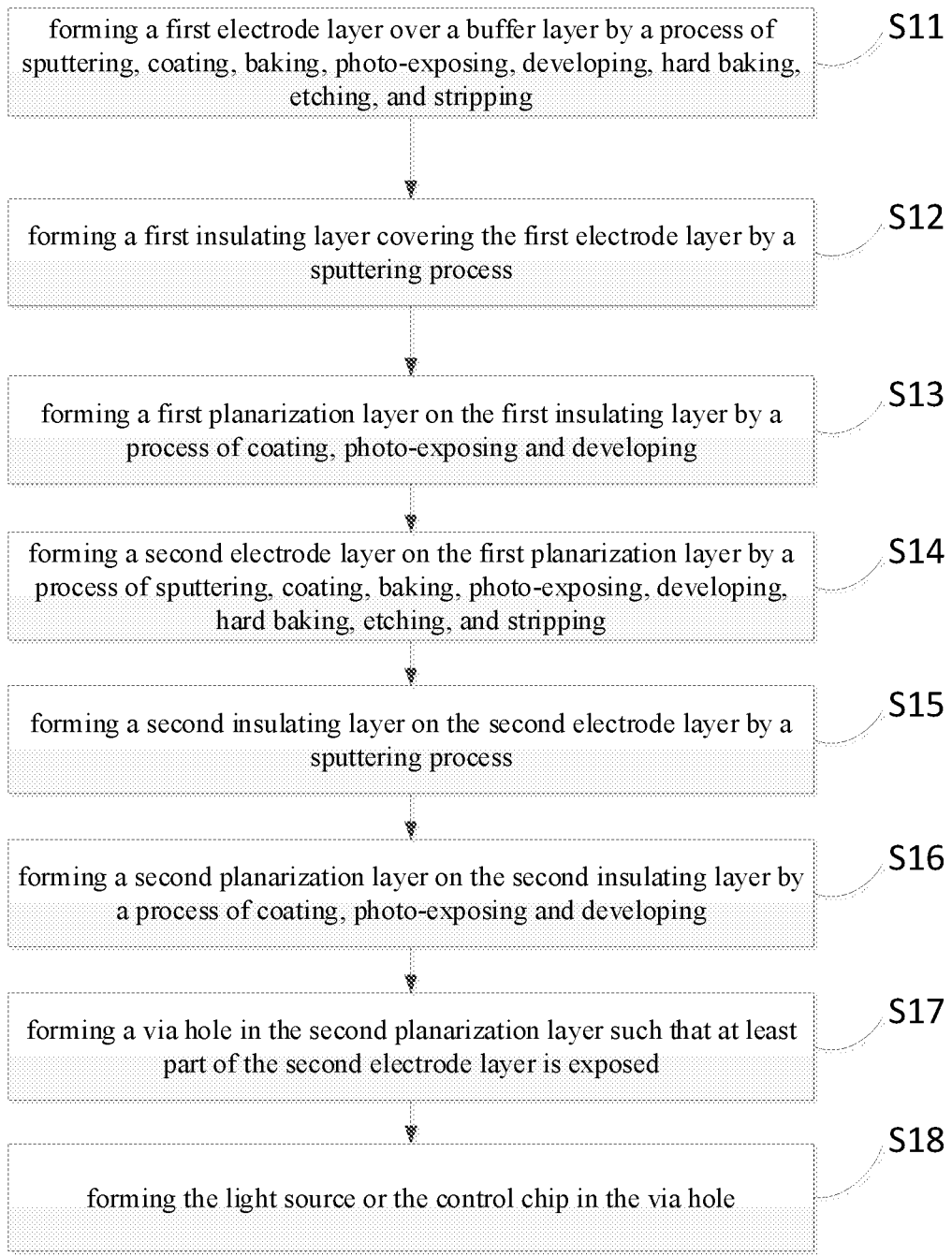
FIG. 6 is a flowchart of a method for manufacturing a driving backplate according to an embodiment of the present disclosure.

As shown in FIG. 5, the present embodiment further provides a method for manufacturing a driving backplate, including steps S11 to S18.

In step S11, a first electrode layer 91 is formed over a buffer layer by a process of sputtering, coating, baking, photo-exposing, developing, hard baking, etching, and stripping.

In an embodiment, the first electrode layer 91 may serve as a voltage terminal in a driving circuit of the driving backplate, such as a reference voltage terminal VDD, a power voltage terminal, and the like. In an embodiment, the first electrode layer may also serve as the signal line.

In step S12, a first insulating layer 92 covering the first electrode layer 91 is formed by a sputtering process.

In step S13, a first planarization layer 93 is formed on the first insulating layer 92 by a process of coating, photo-exposing, and developing.

In step S14, a second electrode layer 94 is formed on the first planarization layer 93 by a process of sputtering, coating, baking, photo-exposing, developing, hard baking, etching, and stripping. In an embodiment, the second electrode layer 94 may serve as a conductive line for electrically coupling the respective light sources.

In step S15, a second insulating layer 95 is formed on the second electrode layer 94 by a sputtering process;

In step S16, a second planarization layer 96 is formed on the second insulating layer 95 by a process of coating, photo-exposing and developing;

In step S17, a via hole 961 is formed in the second planarization layer 96 such that at least part of the second electrode layer 94 is exposed.

In step S18, the light source 4 (lamp bead) or the control chip 2 of the driving backplate is formed in the via hole 961.

In an embodiment, one lamp bead may be disposed in one via hole 961. The lamp beads in each light source region 11 may be coupled through respective pins. The control chip 2 may be coupled to the lamp bead or the signal line 3 through the pins of the control chip.

The embodiment provides a display device, which includes the driving backplate according to the embodiment of the disclosure.

In the display device of the embodiment, because the plurality of control chips 2 in each column are divided into at least two groups, each group of control chips 2 are coupled to the same signal line 3, and the signal lines coupled to the control chips of different groups are coupled in parallel, so the number of the control chips 2 coupled to a single signal line 3 can be well controlled. Compared with the related art (a single signal line is coupled to a large number of control chips 2), the display device of the embodiment enables a single signal line 3 to be coupled to a proper number of control chips 2 by means of grouping, so that the problems of long driving line, long driving time and the like for the light sources 4 in the light source regions 11 can be avoided, and the refresh frequency of the display device having the driving backplate is further ensured.

In addition, because each signal line 3 in the driving backplate is coupled to a proper number of control chips 2 in series, the phenomenon that the current of the signal line 3 is too large due to too much load thereon can be avoided, so that the light source 4 is protected (the phenomenon that the lamp bursts and the like is avoided), and the phenomenon that the parasitic capacitance between the signal lines 3 is too large can be avoided, thereby ensuring the performance of the driving backplate.

In an embodiment, the light source 4 of the present embodiment is a mini light emitting diode (Mini LED), that is, the display device of the present embodiment is a Mini LED liquid crystal display device.

In an embodiment, the display device may be any product or component having a display function, such as a liquid crystal display panel, an electronic paper, a mobile phone, a tablet computer, a television, a display, a notebook computer, a digital photo frame, and a navigator.

It should be noted that, in this context, relational terms such as first and second, and the like are used solely to distinguish one entity or action from another entity or action without necessarily requiring or implying any actual such relationship or order between such entities or actions. Also, the terms "include", "comprise", or any other variation thereof, are intended to cover a non-exclusive inclusion, such that a process, method, article, or apparatus that includes a list of elements includes not only those elements but also other elements not expressly listed or inherent to such process, method, article, or apparatus. Without further limitation, an element defined by the phrase "including an . . . " does not exclude the presence of other identical elements in the process, method, article, or apparatus that includes the element.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A driving backplate comprising:
   a substrate having a plurality of light source regions in which light sources are disposed, the plurality of light source regions being arranged in an array; and
   a plurality of control chips arranged in an array on the substrate, the plurality of control chips being in one-to-one correspondence with the plurality of light source regions and each configured to provide a driving signal to the light sources in a corresponding light source region,
   wherein each column of control chips is divided into at least two groups, each group of control chips are coupled in series through a same signal line, and the at least two groups of control chips are coupled in parallel with each other.

2. The driving backplate of claim 1, wherein each column of control chips is divided into a first group and a second group, and a number of the control chips in the first group is the same as a number of the control chips in the second group.

3. A display device, comprising the driving backplane of claim 2.

4. The driving backplate of claim 2, wherein the first group comprises odd-numbered control chips in the column of control chips and the second group comprises even-numbered control chips in the column of control chips.

5. The driving backplane of claim 4, wherein the light sources in each column of light source regions are coupled to a same power line for providing a power supply voltage to the light sources in the column of light source regions.

6. The driving backplate of claim 2, wherein the first group comprises a first half of the column of control chips and the second group comprises a second half of the column of control chips.

7. The driving backplane of claim 6, wherein the light sources in each column of light source regions are coupled to a same power line for providing a power supply voltage to the light sources in the column of light source regions.

8. The driving backplane of claim 2, wherein every adjacent two of the control chips in each column constitute a pair of control chips, and
the first group comprises odd-numbered pairs of control chips and the second group comprises even-numbered pairs of control chips.

9. The driving backplane of claim 8, wherein the light sources in each column of light source regions are coupled to a same power line for providing a power supply voltage to the light sources in the column of light source regions.

10. The driving backplane of claim 2, wherein the light sources in each column of light source regions are coupled to a same power line for providing a power supply voltage to the light sources in the column of light source regions.

11. The driving backplane of claim 1, wherein the light sources in each column of light source regions are coupled to a same power line for providing a power supply voltage to the light sources in the column of light source regions.

12. The driving backplane of claim 11, wherein each of the plurality of light source regions comprises a plurality of light sources coupled in series.

13. The driving backplane of claim 12, wherein the plurality of light sources in each of the plurality of light source regions are arranged in an array.

14. The driving backplane of claim 13, wherein a number of the plurality of light sources in each of the plurality of light source regions is 4.

15. The driving backplane of claim 1, further comprising a plurality of dummy light source regions arranged in an array, wherein no light sources are disposed in the dummy light source region.

16. The driving backplane of claim 15, wherein the plurality of dummy light source regions are provided with white oil.

17. The driving backplate of claim 16, wherein
the plurality of light source regions and the plurality of dummy light source regions are alternately arranged.

18. The driving backplate of claim 15, wherein
the plurality of light source regions and the plurality of dummy light source regions are alternately arranged.

19. A display device, comprising the driving backplane of claim 1.

20. A method of manufacturing a driving backplate, the driving backplate being the driving backplate of claim 1, the method comprising:
forming a first electrode layer over a buffer layer by a process of sputtering, coating, baking, photo-exposing, developing, hard baking, etching, and stripping;
forming a first insulating layer covering the first electrode layer by a sputtering process;
forming a first planarization layer on the first insulating layer by a process of coating, photo-exposing and developing;
forming a second electrode layer on the first planarization layer by a process of sputtering, coating, baking, photo-exposing, developing, hard baking, etching, and stripping;
forming a second insulating layer on the second electrode layer by a sputtering process;
forming a second planarization layer on the second insulating layer by a process of coating, photo-exposing and developing;
forming a via hole in the second planarization layer such that at least part of the second electrode layer is exposed; and
forming the light source or the control chip in the via hole,
wherein the first electrode layer serves as the signal line, and the second electrode layer serves as a conductive line coupled to the light source.

* * * * *